(12) United States Patent
Mihara et al.

(10) Patent No.: US 6,502,273 B1
(45) Date of Patent: Jan. 7, 2003

(54) CLEANING SPONGE ROLLER

(75) Inventors: Koji Mihara, Hyogo (JP); Shuki Gohda, Ibaraki (JP); Masao Ide, Ibaraki (JP); Koei Igarashi, Ibaraki (JP); Konomu Tokunaga, Ibaraki (JP); Hiroshi Miyaji, Chiba (JP)

(73) Assignee: Kanebo, Ltd., Tokyo (JP)

( * ) Notice: Subject to any disclaimer, the term of this patent is extended or adjusted under 35 U.S.C. 154(b) by 0 days.

(21) Appl. No.: 09/503,626

(22) Filed: Feb. 11, 2000

Related U.S. Application Data

(63) Continuation-in-part of application No. 09/297,617, filed as application No. PCT/JP97/03971 on Oct. 31, 1997, now abandoned.

(30) Foreign Application Priority Data

Nov. 8, 1996 (JP) .............................. 8-312867
Feb. 26, 1999 (JP) ........................... 11-051274

(51) Int. Cl.[7] .............................. B08B 1/04
(52) U.S. Cl. .................. 15/230.16; 15/102; 492/31; 492/33; 492/36
(58) Field of Search .................. 15/97.1, 102, 230, 15/230.16, 244.1, 244.4; 492/30, 31, 33, 36; D32/40, 50

(56) References Cited

U.S. PATENT DOCUMENTS

| | | | |
|---|---|---|---|
| 4,482,391 A | * | 11/1984 | Pettingell et al. .... 15/230.16 X |
| 4,566,911 A | * | 1/1986 | Tomita et al. ....... 15/230.16 X |
| 4,969,226 A | * | 11/1990 | Seville ................. 15/244.4 |
| 5,311,634 A | * | 5/1994 | Andros ................ 15/102 X |
| 5,806,126 A | | 9/1998 | de Larios et al. ........ 15/102 |
| 5,875,507 A | * | 3/1999 | Stephens et al. ......... 15/102 |
| 5,933,904 A | * | 8/1999 | De Guzman .......... 15/244.4 X |
| 5,966,765 A | * | 10/1999 | Hamada et al. ......... 15/102 X |
| 6,041,465 A | * | 3/2000 | Yashiki et al. .......... 15/102 X |
| 6,080,092 A | * | 6/2000 | Cercone et al. ............ 492/30 |

FOREIGN PATENT DOCUMENTS

| | | |
|---|---|---|
| JP | 59-006974 | 1/1984 |
| JP | 60-186085 | 12/1985 |
| JP | 1-006953 | 2/1989 |
| JP | 03-257456 | 11/1991 |
| JP | 5-028759 | 7/1993 |
| JP | 8-117717 | 5/1996 |
| JP | 10-034091 | 2/1998 |
| JP | 10-180198 | 7/1998 |
| WO | 97/47406 | 12/1997 |

* cited by examiner

Primary Examiner—Mark Spisich
(74) Attorney, Agent, or Firm—Hogan & Hartson, LLP

(57) ABSTRACT

A cleaning sponge roller is made of a polyvinyl acetal-based porous sponge having elasticity in a wet state and comprises a generally cylindrical roll body and a plurality of protrusions molded integrally on the periphery of the roll body. The cleaning sponge roller rotatingly cleans a material to be cleaned by contacting the top portions of the protrusions with the surface of the material and brushing off polishing residues found on the surface of the material. Each of the protrusions has a tapered protruding base portion extending from the periphery of the roll body, and a protruding end portion having almost the same sectional shape from the top end surface of the protruding base portion to the top portion.

7 Claims, 5 Drawing Sheets

CLEANING SPONGE ROLLER

CROSS-REFERENCE TO RELATED APPLICATION

This is a continuation-in-part of application Ser. No. 09/297,617, filed Jun. 25, 1999, abandoned, which is a national stage of PCT/JP97/03971 filed Oct. 31, 1997 which is hereby incorporated by reference in its entirety.

BACKGROUND OF THE INVENTION

1. Field of the Invention

The present invention generally relates to a cleaning sponge roller for removing fine particles such as abrasive grains, swarfs and scobs off the surface of a material. More particularly, the present invention relates to a sponge roller for cleaning a material surface in the process of producing substrates such as magnetic recording aluminum discs, semiconductor silicon wafera, and the like. The present invention also relates to a mold for forming the sponge roller.

2. Description of Related Art

A process of producing a hard disc, a silicon wafer, or the like (including, but not limited to, a glass disc, a semiconductor element which is subjected to a chemical mechanical polishing (CMP) work, a photomask, a liquid glass substrate, etc.) requires a step of high precision abrasion or "polishing," which provides a surface of the disk or wafer with an extremely high precision finish. The high precision finish is achieved by polishing the surface with abrasive grains such as silicon oxide particles, alumina particles or cerium particles. When this step is complete, however, the surface is contaminated with the residue of the polishing, such as grains, swarfs and/or scobs. The residue must be cleaned before the material can undergo a subsequent step.

Several conventional cleaning methods have been known. The RCA cleaning method, one of the conventional methods for cleaning silicon wafers, uses a mixture of aqueous ammonia and hydrogen peroxide and a mixture of dilute hydrofluoric acid, hydrochloric acid and hydrogen peroxide. Another conventional method for cleaning a hard disc, silicon wafer, etc. is a method of using a cleaning sponge roller made of a polyvinyl acetal-based ("PVAt-based") porous material.

For example, as shown in FIG. 6, a sponge roller 51 is used to clean a surface 9a of a material 9. The sponge roller 51 typically includes a roll body 3 having a peripheral area 3a and a plurality of protrusions 53 integrally protruding from the peripheral area 3a. A top portion 53b of the protrusion 53 is brushed in a direction indicated by an arrow against the surface 9a of the material 9 by pressing the protrusions 53 onto the surface 9a and subsequently separating the protrusions 53 from the surface 9a. The pressing and separating motions are repeated. As a result, the material 9 is brushed with the sponge.

As shown in FIG. 6, the protrusions 53 are generally columnar shaped, having almost the same cross-sectional shape from a base end surface 53a of the protrusion 53 to a top end surface 53b. When such columnar shaped protrusions brush against the surface 9a, a tension acting on the protrusion 53 concentrates at the base end surface 53a and causes the base end surface 53a to be locally deformed in its vicinity. In addition, since the peripheral area 3a is not completely flat but inclines toward the opposite side of the protruding direction of the protrusion 53 in a shape of a circular arc, it is not cleanly deformed in a lateral direction compared to a case wherein the protrusion is attached to a completely flat surface. Therefore, a front-end portion 55 connecting the base end surface 53a with the periphery 3a of the roll. body 3 becomes easily broken.

Such a problem can be solved by forming the protrusions in a larger size to enhance the strength thereof. However, this creates another set of problems in that a desired brushing effect is not obtained and the cleaning effect may be lowered.

SUMMARY OF THE INVENTION

It is an object of an embodiment of the present invention to provide a PVAt-based sponge roller with an improved durability without decreasing the quality of cleaning performance.

To attain the object described above, in accordance with one embodiment of the present invention, a cleaning sponge roller has a generally cylindrical roll body and a plurality of protrusions molded integrally on the periphery of the roll body. The periphery of the roll body rotates and brushes polishing residue off the material to be cleaned. Each of the protrusions of the roll body has a tapered protruding base portion extending from the periphery of the roll body, and a protruding end portion having generally the same sectional shape extending from the top end of the protruding base portion to the top portion of the protruding end portion. The protruding base portion may be formed in a shape of generally truncated cone. The protruding end portion may be formed in a generally columnar shape or a generally cylindrical shape.

With the above construction, the protruding base portion of the protrusion has an outer surface formed in a divergent shape toward the periphery of the roll body and a sectional area of the protruding base portion attains a maximum at the base end (border between the periphery of the roll body and the protruding base portion) and gradually decreases toward the protruding end portion. Therefore, when each of the protrusions is pressed in the lateral direction, a stress concentration in the vicinity of the base end of the protruding base portion where the tension is concentrated is dispersed in the whole protruding base portion. Thus, the protrusion according to the present invention is significantly more durable than the protrusions of conventional sponge rollers.

Since the durability of the protrusions can be improved without exerting any influence on the shape of the protruding end portion, the protruding end portion that is to be contacted with the material to be cleaned can readily be formed into a size and a shape that are most suitable for brushing.

In accordance with one embodiment, a cleaning sponge roller is formed from a polyvinyl acetal-based porous sponge that is obtained by reacting a viscous mixed solution containing raw materials in a mold. The mold corresponding to the sponge roller with the above construction comprises a first space for forming a roll body and a plurality of second spaces for forming protrusions. Each of the second spaces comprises a base portion forming space for forming a protruding base portion and an end portion forming space for forming a protruding end portion. The base portion forming space communicates with the first space on one side and the end portion forming space on the other.

The base portion forming space has an inclined surface extending toward the first space from the end portion forming space. In the production of the sponge roller, the mixed solution is poured into the first space and then the solution flows into each second space from the first space. In this case, since the base portion forming space of the second space has an inclined surface extending toward the first space, the mixed solution flows smoothly into the end portion forming space guided by the inclined surface of the base portion forming space. At the same time, an air in the second space moves smoothly to the first space from the end portion forming space and then is released in the air from the first space. Consequently, the mixed solution can be securely charged to the terminal end of the second space, thereby making it possible to reduce the production cost due to an improvement in yield.

The height from the periphery of the roll body to the top end of the protruding base portion is preferably not more than one-half, and more preferably not less than one-fifth times as long as that of the protrusion.

When the height of the protruding end portion exceeds one-half times as long as that of the whole protrusion, there is a possibility that the deformation amount of the protruding end portion is reduced and the brushing effect on cleaning becomes insufficient. On the other hand, when the height of the protruding end portion exceeds one-fifth times as long as that of the whole protrusion, there is a possibility that sufficient strength cannot be obtained.

The crossed axes angle between a straight line, which connects the base end and top end of the outer surface of the protruding base portion, and the periphery of said roll body in an arbitrary section is preferably from 30° to 60°.

When the crossed axes angle is smaller than 30°, there is a possibility that the protruding base portion may extend largely toward the periphery and an area of the lower end surface of the protruding end portion may increase, thereby limiting the total number of the protrusions which may be formed on the periphery of the roll body. On the other hand, when the crossed axes angle exceeds 60°, there is a possibility that sufficient strength may not be obtained.

Furthermore, the shape of the outer surface of the protruding base portion may also be a linear inclined surface or a curved inclined surface.

DETAILED DESCRIPTION OF THE INVENTION

Figure 1A:
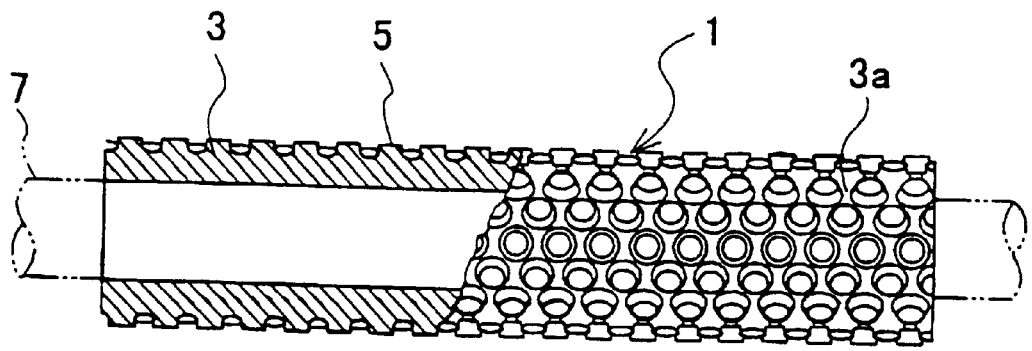
FIG. 1(a) is a partially cut perspective view of a cleaning sponge roller according to a first embodiment of the present invention.

FIG. 1(a) is a partially cut perspective view of a cleaning sponge roller 1 according to a first embodiment of the present invention. The cleaning sponge roller 1 is made of a polyvinyl acetal-based porous material (PVAt-based porous material) which is elastic in a wet state but cured in a dry state. The PVAt-based porous material has excellent water absorption properties and water retention properties and presents preferable flexibility, suitable impact resilience, and good wear resistance.

The sponge roller 1 comprises a generally cylindrical roll body 3 and a plurality of protrusions 5 molded integrally on the periphery 3a of the roll body 3.

Figure 1B:
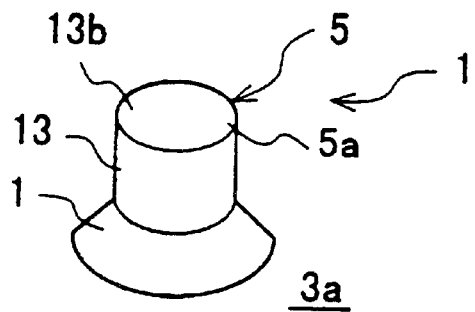
FIG. 1(b) is an enlarged perspective view of a protrusion of the sponge roller shown in FIG. 1(a).
Figure 1C:
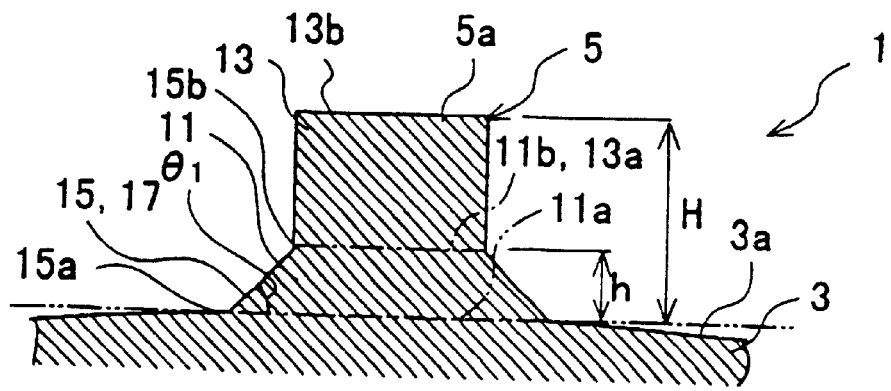
FIG. 1(c) is a sectional view of the protrusion of the sponge roller shown in FIG. 1(b).

FIG. 1(b) and FIG. 1(c) illustrate an enlarged view of the protrusion 5 of the sponge roller 1 shown in FIG. 1(a). The protrusion 5 comprises a protruding base portion 11 protruding integrally from the periphery 3a of the roll body 3, and a protruding end portion 13 extending integrally from a top end surface 11b of the protruding base portion 11. A base end surface 11a of the protruding base portion 11 is included in the periphery 3a of the roll body 3. The top end surface 11b of the protruding base portion 11 and the base surface 13a of the protruding end portion 13 are the same.

The protruding base portion 11 is formed in a shape of a generally truncated cone which is tapered toward the top end surface 11b from the base end surface 11a. The protruding base portion 11 has an inclined surface 15 connecting the base end surface 11a and the top end surface 11b of the protruding base portion 11; the base end surface 11a connects the inclined surface 15 at a base end 15a, while the top end surface 11b connects the inclined surface 15 at a top end 15b. The inclined surface 15 is formed linearly and divergently from the top end 15a toward the bottom end 15b.

The protruding end portion 13 extends in a direction almost perpendicular to the periphery 3a of the roll body 3, and is formed on top of the top end surface 11b of the protruding base portion 11. The protruding end portion 13 has a generally cylindrical shape having almost the same cross-sectional shape from the base end surface 13a to the top end surface 13b. The top end surface 13b of the protruding end portion 13 approximately perpendicularly connects the periphery of the protruding end portion 13.

The protruding base portion 11 has a height h, which represents the distance measured along a line perpendicular to the periphery 3a from the base end surface 11a to the top end surface 11b. The protrusion 5 has a height H, which represents the distance also measured along the line perpendicular to the periphery 3a from the periphery 3a of the roller body 3 to the top end surface 13b of the protruding end portion 13 which also constitutes a top end surface of the protrusion 5. The height h of the protruding base portion 11 is set within an approximate range of one-fifth to one-half of the height H of the protrusion 5. A straight line 17 on the inclined surface 15, represents the shortest distance between the base end 15a and the top end 15b of the inclined surface 15. The straight line 17 intersects with the periphery 3a of the roll body 3 at angle $\theta_1$ ranging from 30° to 60°.

Figure 2:
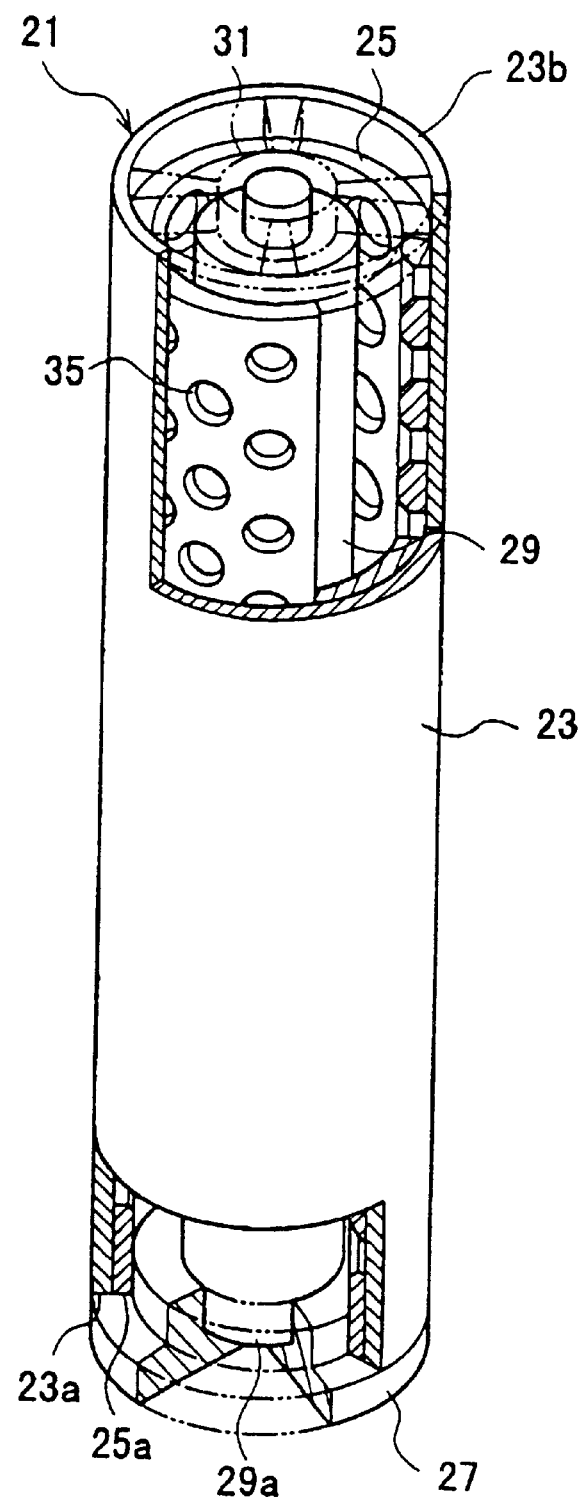
FIG. 2 is a partially cut perspective view of a mold for molding the sponge roller shown in FIG. 1(a).

The cleaning sponge roller 3 is obtained, for example, by mixing one or more polyvinyl alcohols (raw materials) having a mean polymerization degree of 300 to 2000 and a saponification degree of not less than 80% to form an aqueous solution; adding aldehydes as cross-linking agents, minerals as catalysts and a starch as a pore-forming agent to the aqueous solution; pouring a mixed solution thereof into a mold 21 as shown in FIG. 2; reacting the mixed solution at 50–80° C.; taking out the reaction product from the mold 21; and washing it with water to remove the pore-forming agent.

The mold 21 comprises an outer mold 23, an inner mold 25, a bottom plate 27, a mandrel 29 and a cap 31. Both of the outer mold 23 and inner mold 25 are formed in a cylindrical shape. The inner mold 25 has an outer diameter, which is the same as or slightly smaller than an inner diameter of the outer mold 23, and is inserted into the outer mold 23. The mandrel 29 is inserted into almost the center of the inner mold 25. The bottom plate 27 serves to cover lower ends 23a and 25a of the outer mold 23 and inner mold 25, respectively, and to support a lower end 29a of the mandrel 29. The cap 31 is fit within an upper end 23b of the outer mold 23. The mandrel 29 is positioned by the bottom plate 27 and cap 31.

Figure 3:
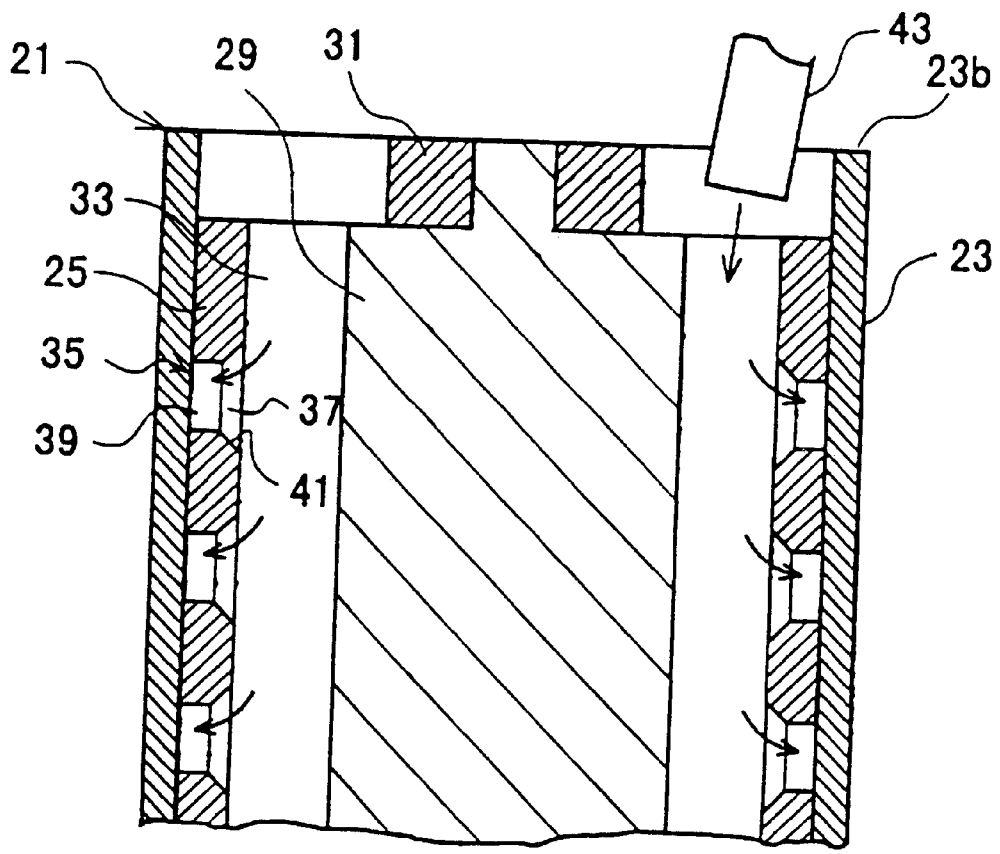
FIG. 3 is a sectional view showing a process for producing the sponge roller shown in FIG. 1(a).

As shown in FIG. 3, a generally cylindrical first space 33 for forming the roll body 3 is partitioned between the inside of the inner mold 25 and the periphery of the mandrel 29. The inner mold 25 is provided with a plurality of through holes (second spaces) 35 for forming the protrusion 5. Each of the through holes 35 comprises a base portion forming space 37 for forming the protruding base portion 11 and an end portion forming space 39 for forming the protruding end portion 13. The base portion forming space 37 is connected to the first space 33 and the end portion forming space 39 is connected to the base portion forming space 37. The base portion forming space 37 has an inclined surface 41 extending toward the first space 33 from the end portion forming space 39.

The mixed solution is poured into the first space 33 through a casting nozzle 43 inserted between the outer mold 23 and the cap 31, and then the solution flows into each of the through holes 35 from the first space 33. In this case, the mixed solution flows smoothly into the end portion forming space 39 guided by the inclined surface 41 extending toward the first space 33. At the same time, an air in the through hole 35 moves smoothly from the end portion forming space 39 to the first space 33 and then is released in the air. Consequently, the mixed solution can securely fill up to the terminal end of the through hole 35 (end portion forming space 39). Accordingly, the yield is improved and the production cost is reduced.

For a PVAt-based porous material, a material having a 30% compression stress in a proper water-containing state of 15 to 150 g/cm² is preferred. The "proper water-containing state" refers to a water-containing state where the PVAt-based porous material can exhibit proper plasticity, and the water content (weight percentage in the water-containing state based on the dry state) is within a range from about 100% to 1000%. The "30% compression stress" refers to a value obtained by cutting the PVAt-based porous material in a proper water-containing state so that a distance between both end surfaces (height in the longitudinal direction) becomes 30 mm, mounting the cut sample in a digital load measuring apparatus so that a load is applied to the whole end surface, compressing in the longitudinal direction by 30% (9 mm), measuring the load at which the cut sample was broken, and dividing the load by an area of the end surface.

The upper limit of the preferred range of 30% compression stress in the proper water-containing state is set at 150 g/cm² because a PVAt-based porous material having a higher water-containing state than 150 g/cm² does not exhibit elasticity required for brushing. Similarly, the lower limit of the preferred range of the 30% compression stress in the proper water-containing state is set to 15 g/cm² because a PVAt-based porous material having a lower water-containing state than 15 g/cm² is too soft and causes distortion when the roll body 3 is rotated.

For a PVAt-based porous material, a material having a porosity of 85% to 95% and an average pore diameter of 10 gm to 200 gm is preferred. When the porosity is smaller than 85%, the flexibility in a wet state becomes insufficient. Similarly, when the porosity is larger than 95%, no material is suited for cleaning because of an insufficient practical strength. When an average pore diameter is smaller than 10 gm, a sufficient brushing effect cannot be obtained because of insufficient elasticity in a wet state. Similarly, when an average pore diameter exceeds 200 gm, the material is not suited for cleaning because of an excessive coarse pitch between the pores.

The "porosity" according to the embodiment is obtained by measuring with a dry automatic densimeter an apparent volume and a true volume of a PVAt-based porous material having a shape of a rectangular, parallelepiped and dried in a drying oven, and then calculated in accordance with the following equation.

$$\text{Porosity \%} = (\text{apparent volume} - \text{true volume})/\text{apparent volume} \times 100 \qquad (1)$$

The "average pore diameter" is a value measured in accordance with ASTM (Designation: D4404-84) and is specifically a value determined by the measurement of the diameter of pores in accordance with a mercury penetration process using a mercury porosimeter manufactured by Porous Material, Inc.

A cleaning process using the sponge roller 1 will be described hereafter.

Figure 4:
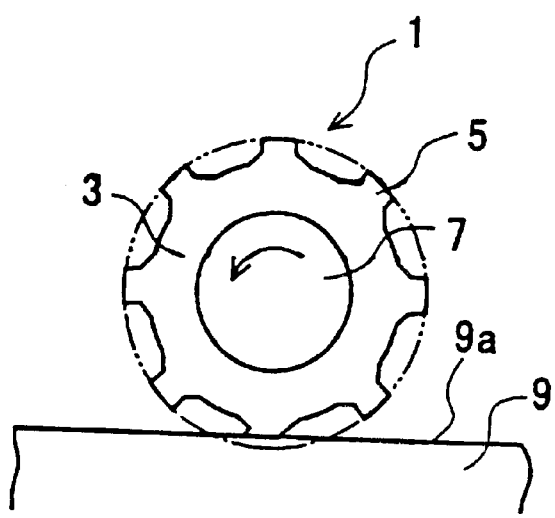
FIG. 4 is a side view schematically showing the operation of the sponge roller shown in FIG. 1(a).
Figure 5:
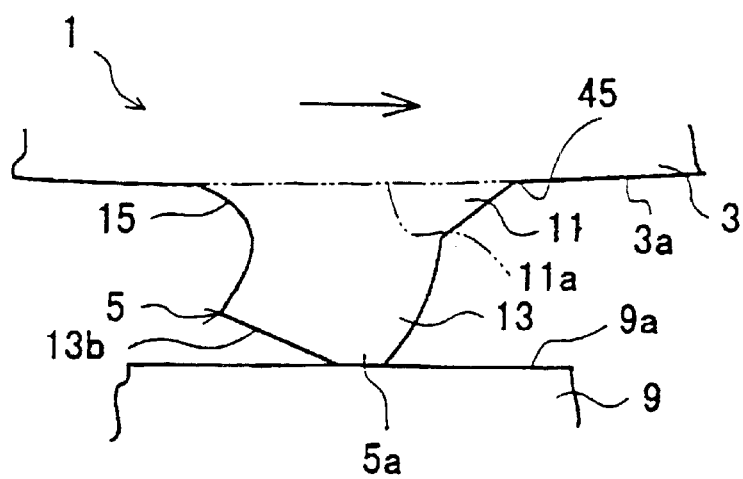
FIG. 5 is an enlarged view showing operation of the principal portion of the sponge roller of FIG. 4.

As shown in FIG. 4, a rotating axis 7 is inserted into a hollow portion of a sponge roller 1 and a roll body 3 is fixed to the rotating axis 7. The cleaning of a material 9 to be cleaned is conducted by rotating the rotating axis 7 so that a top portion 5a of a protrusion 5 rotatingly contacts the surface 9a of the material 9. The top portion 5a of the protrusion 5 comprises the top end surface 13b of the protruding end portion 13. As shown in FIG. 5, the top portion 5a of the protrusion brushes the surface 9a by repeatedly pressing the protrusion 5 in a lateral direction onto, and separating the protrusion 5 from, the material 9. A state in which the protrusion is pressed onto the material 9 is called the deformed state, whereas a state in which the protrusion 5 is separated from the material 9 is called the deformation released state. In other words, the cleaning is conducted by repeating the deformed state, each of the deformed states followed by the deformation released state.

Figure 6:
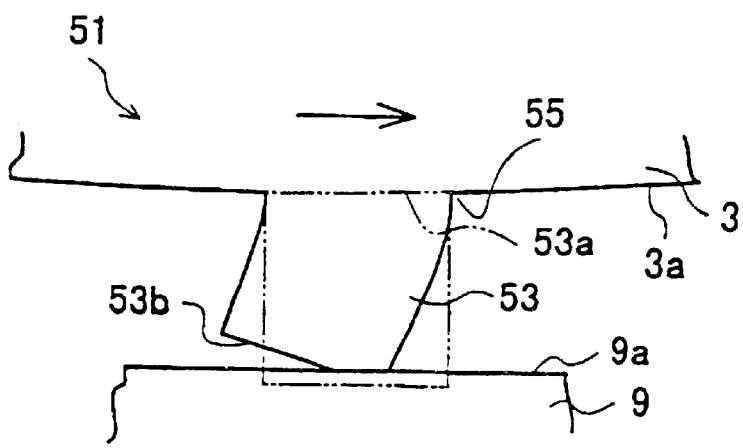
FIG. 6 is an enlarged view showing the operation of the principal portion of a conventional sponge roller.

When the sponge roller 1 undergoes a brushing motion, a tension acting on the protrusion 5 concentrates at a base end (a base end surface 11a of a protruding 11). This is similar to the case shown in FIG. 6 explained above, wherein the tension concentrated at the front end 55 causes the protrusion 53 to be easily broken. However, as shown in FIG. 5, the protruding base portion 11 according to the present embodiment has the outer surface 15 formed divergently toward the periphery 3a of the roll body 3. Thus, a sectional area of the protruding base portion 11 is at its maximum at the base end surface 11a and gradually decreases toward the protruding end portion 13. Therefore, when the protrusion 5 is pressed in a lateral direction, the stress concentration in the vicinity of the base end surface 11a is released. Accordingly, the tension is dispersed in the whole protruding base portion 11 and the deformation and the resulting breakage in the vicinity of a front end 45 in the transfer direction of the base end surface 11a is securely prevented. Accordingly, the durability of the protrusion 5 is increased.

Since the durability of the protrusion 5 can be improved by varying the protruding base portion 11 and without by varying the protruding base portion 11 and any influence on the shape of the protruding end portion 13, the protruding end portion 13 to be contacted with the material 9 to be cleaned can be freely set to the size and shape which are most suitable for brushing.

Hereinafter, a comparative tensile strength test will be described. The test concerns a comparison of a tensile strength of an objective sample of the protrusion 5 of the sponge roller shown in FIG. 1(*b*) to a comparative sample of the protrusion 53 of the sponge roller shown in FIG. 6. For each of the objective sample and comparative sample, a PVAt-based porous material having a porosity of 90% and a compression stress 30% in a proper water-containing state of 60 g/CM2 was used.

As for the protrusion 5 of the objective sample, a protrusion having the following characteristics is used: a total height H being 4.5 mm, an outer diameter of the protruding end portion being 7.5 mm, a height h of the protruding base portion 11 being 1.5 mm, a crossed axes angle $\theta_1$ between the outer surface 3*a* and inclined surface 15 being about 45°, and an outer diameter of the base end surface 11*a* of the protruding base portion 11 being 10.5 mm. As for the protrusion 53 of the comparative sample, a protrusion having the following characteristics is used: a total height being 4.5 mm and an outer diameter being 7.5 mm.

The procedure of the test will be described hereinafter. The protrusions 5 and 53 are clamped by a clip (not shown) in a state where the roll body 3 of each sample is retained between chucks (not shown) and the clip is stretched until the protrusions 5 and 53 are broken. At that point, the tensile strength of each roller is measured.

Figure 8:
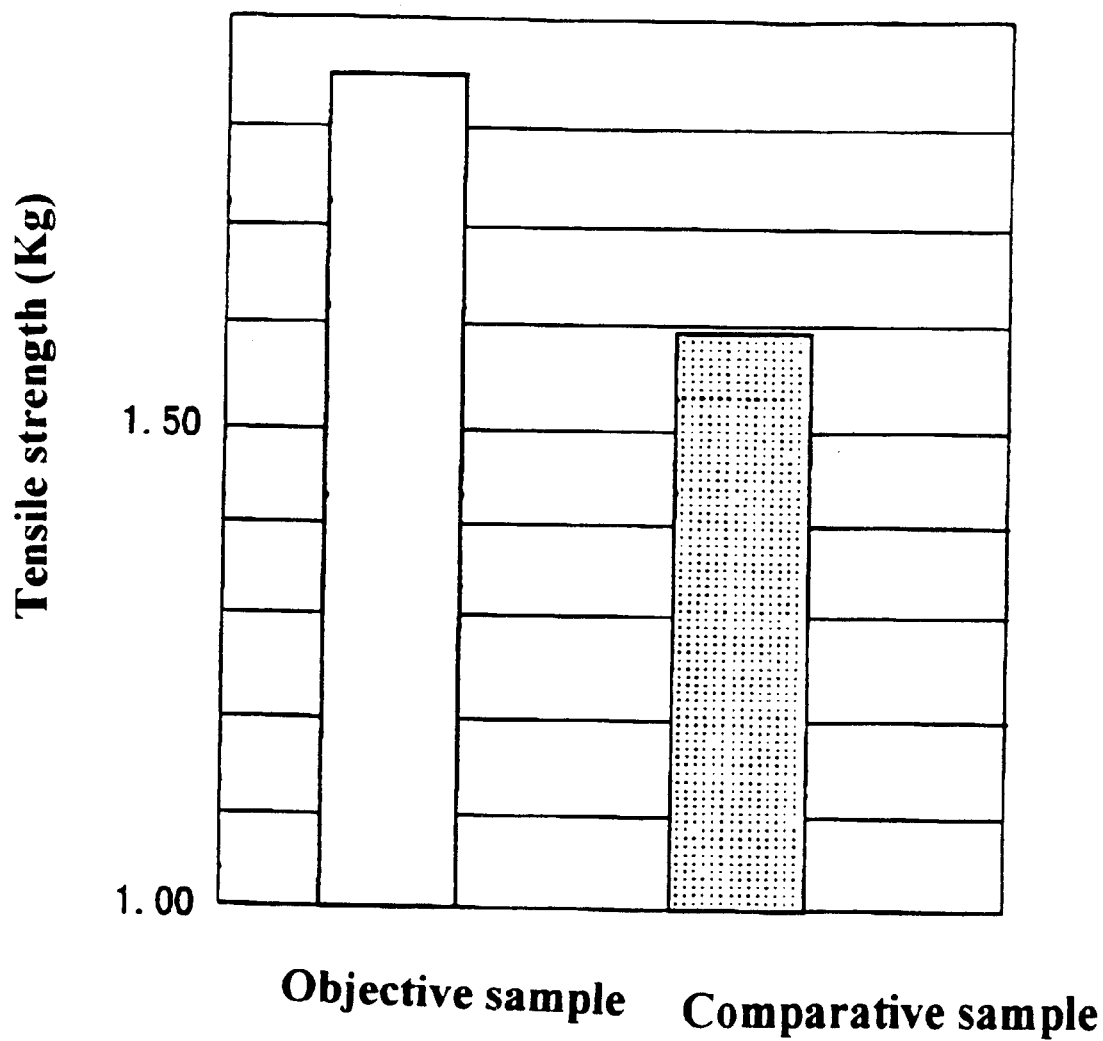
FIG. 8 is a graph showing the results of comparison tests of the tensile strengths between a sponge roller having conventional type protrusions and the sponge roller having the type of protrusions according to the present invention.

The test results as shown in FIG. 8 reveal that the protrusion of the comparative sample broke when the stretching load was increased to 1.59 kg, whereas the protrusion of the objective sample did not break until the stretching load was 1.85 kg. Accordingly, the tensile strength of the objective sample is larger than that of the comparative sample by 16.4%.

Figure 7:
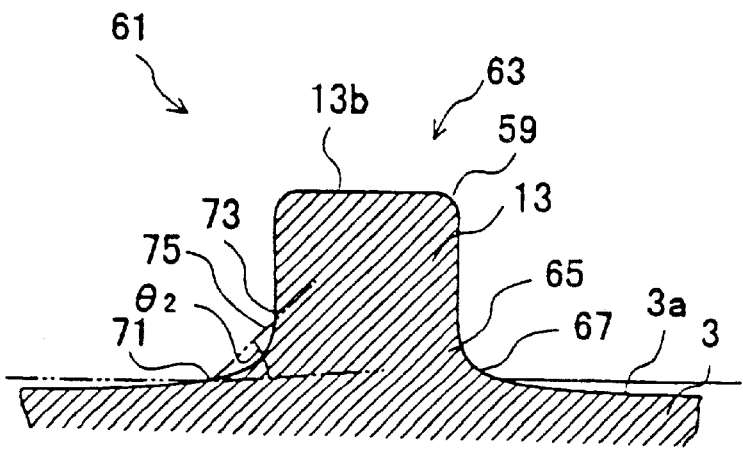
FIG. 7 is a sectional view showing a protrusion of the sponge roller according to a second embodiment of the present invention.

The second embodiment of the present invention will be described below in reference to FIG. 7. FIG. 7 shows an enlarged sectional view of the principal portion, which shows a protrusion 63 of a PVAt-based cleaning sponge roller 61 according to the second embodiment. The protrusion 63 according to the second embodiment differs from the protrusion 5 according to the first embodiment in that the protruding base portion 65 of the protrusion 63 has a curved outer surface 67 and that a curved portion 59 is provided between the periphery 3*a* of the roller body 3 and the top end surface 13*b* of the protruding end portion 13.

A crossed axes angle $\theta_2$ between a straight line 75, which connects the base end 71 and top end 73 of the outer surface 67 of the protruding base portion 65 shown in FIG. 7, and the periphery 3*a* of the roll body 3 in the cross section is set at approximately 30° to 60°.

In accordance with this embodiment, in the same manner as that in the first embodiment, not only can the durability of the protrusions 63 be improved without adversely affecting the cleaning performance, but also the production cost can be reduced due to an improvement in yield.

With respect to the shape of the cross section of the protruding base portions 11 and 65 and the protruding end portion 13, a generally circular shape is used in the above explanation of the first and second embodiments. However, according to the present invention, the shape is not limited thereto and the cross section can take various shapes such as rectangle, ellipse, oval, etc.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A cleaning sponge roller made of a polyvinyl acetal-based porous sponge having elasticity in a wet state, comprising:

a generally cylindrical roll body defining a periphery; and a plurality of protrusions integrally molded to the periphery of the roll body, each of said protrusions having a tapered protruding base portion extending from the periphery of the roll body and a protruding end portion having a generally uniform sectional shape extending from a top end of the protruding base portion to a top portion of the protruding end portion;

wherein the protruding base portion is formed in a shape of a generally truncated cone and the protruding end portion is formed in a generally columnar shape.

2. The cleaning sponge roller according to claim 1, wherein a height of the protruding base portion from the periphery of the roll body to the top end of the protruding base portion is one-fifth to one-half of a total height of each of the protrusions, including the protruding base portion and the protruding end portion, and a crossed axes angle between a straight line, which connects a base end and a top end of an outer surface of the protruding base portion with the periphery of the roll body in an arbitrary section is in the range of 30° to 60°.

3. A cleaning sponge roller made of a polyvinyl acetal-based porous sponge having elasticity in a wet state comprising:

a generally cylindrical roll body defining a periphery; and a plurality of protrusions integrally molded to the periphery of the roll body, each of said protrusions having a tapered protruding base portion extending from the periphery of the roll body and a protruding end portion having a generally uniform sectional shape extending from a top end of the protruding base portion to a top portion of the protruding end portion, wherein a height of the protruding base portion from the periphery of the roll body to the top end of the protruding base portion is one-fifth to one-half of a total height of each of the protrusions, including the protruding base portion and the protruding end portion, and a crossed axes angle between a straight line, which connects a base end and a top end of an outer surface of the protruding base portion with the periphery of the roll body in an arbitrary section is in the range of 30° to 60°.

4. A cleaning sponge roller made of a polyvinyl acetal-based porous sponge having elasticity in a wet state, comprising:

a generally cylindrical roll body defining a periphery; and a plurality of protrusions integrally molded to the periphery of the roll body, each of said protrusions having a tapered protruding base portion extending from the periphery of the roll body and a protruding end portion having a generally uniform sectional shape extending from a top end of the protruding base portion to a top portion of the protruding end portion, wherein the protruding base portion is formed in a shape of a truncated cone and the protruding end portion is formed in a columnar shape.

5. The cleaning sponge roller according to claim 4, wherein a sectional area of each protrusion, including the protruding base portion and the protruding end portion, attains a maximum at a base end of the protruding base portion.

6. The cleaning sponge roller according to claim 4, wherein said protruding base portion has an outer surface formed in a divergent shape toward the periphery of the roll body.

7. The cleaning sponge roller according to claim 4, wherein a sectional area of the protruding base portion attains a maximum at a base end of the protruding base portion.

* * * * *